United States Patent [19]

Nulman et al.

[11] Patent Number: 5,098,198

[45] Date of Patent: Mar. 24, 1992

[54] WAFER HEATING AND MONITOR MODULE AND METHOD OF OPERATION

[75] Inventors: Jaim Nulman, Palo Alto; Dan Maydan, Los Altos Hills, both of Calif.

[73] Assignee: Applied Materials, Inc., Santa Clara, Calif.

[21] Appl. No.: 758,374

[22] Filed: Sep. 3, 1991

Related U.S. Application Data

[63] Continuation of Ser. No. 510,710, Apr. 19, 1990, abandoned.

[51] Int. Cl.[5] .............................. G01J 5/00; G01J 5/12
[52] U.S. Cl. .................................. 374/121; 374/126; 374/179; 250/492.2
[58] Field of Search ............... 374/120, 121, 126, 128, 374/129, 132, 133, 179; 250/338.1, 492.1, 492.2; 356/51

[56] References Cited

U.S. PATENT DOCUMENTS

| | | | |
|---|---|---|---|
| 3,796,099 | 3/1974 | Shimotsuma et al. | 374/126 |
| 4,001,586 | 1/1977 | Fraioli | 250/338.1 |
| 4,435,092 | 3/1984 | Iuchi | 374/124 |
| 4,456,919 | 6/1984 | Tomita et al. | 374/128 |
| 4,764,026 | 8/1988 | Powell et al. | 374/178 |
| 4,854,727 | 8/1989 | Pecot et al. | 374/121 |
| 4,890,245 | 12/1989 | Yomoto et al. | 356/51 |
| 4,919,542 | 4/1990 | Nulman et al. | 374/128 |
| 4,969,748 | 11/1990 | Crowley et al. | 374/126 |

FOREIGN PATENT DOCUMENTS 2629912  10/1989  France .............................. 374/121

Primary Examiner—William A. Cuchlinski, Jr.
Assistant Examiner—C. W. Fulton
Attorney, Agent, or Firm—Birgit E. Morris; Philip A. Dalton

[57] ABSTRACT

The temperature of a semiconductor wafer during annealing of metallization is accurately and indirectly monitored by supporting the wafer on a thin susceptor of constant emissivity and monitoring the temperature of the susceptor. The system has the added advantage of providing efficient, controlled heating of the wafer by radiant heating of the backside of the susceptor.

20 Claims, 2 Drawing Sheets

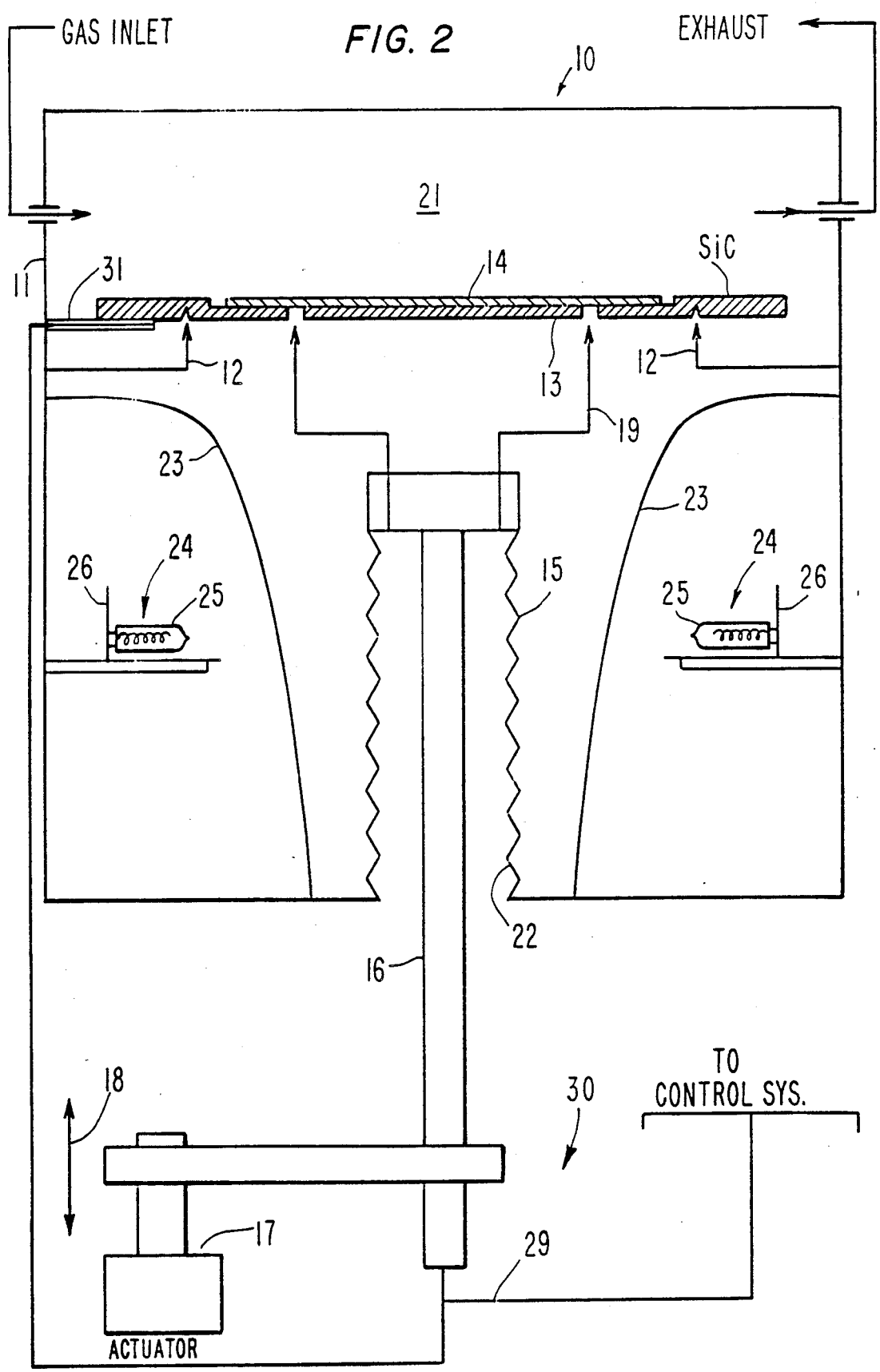

WAFER HEATING AND MONITOR MODULE AND METHOD OF OPERATION

This is a continuation of U.S. application Ser. No. 07/510,710, filed Apr. 19, 1990, now abandoned.

FIELD OF THE INVENTION

The present invention relates to the heat treatment of integrated circuit wafers, to apparatus and methods for measuring the temperature of IC wafers during the heat treatment thereof, and, in particular, to apparatus and methods for monitoring the temperature of wafers during the annealing of integrated circuit metallization formed on the wafers.

BACKGROUND OF THE INVENTION

Annealing metallization formed on integrated circuit wafers requires accurate control of the semiconductor wafer temperature and, thus, accurate monitoring of the wafer temperature. Perhaps the preferred temperature monitoring technique for such wafers uses IR (infrared) sensors to detect the the heat energy emitted from the wafer. IR sensing is preferred in part because the sensor can be located remotely, outside the processing chamber, and because of the potential accuracy of this technology. However, the potential accuracy of the IR sensing technology has not been fully realized, in part because the varied topography and the constituent materials of the integrated circuit structures formed on a wafer make it difficult to accurately monitor the temperature of the wafer

SUMMARY OF THE INVENTION

Objects

In view of the above discussion, it is a primary object of our present invention to provide an apparatus and a process for accurately heating a semiconductor wafer and for accurately monitoring the temperature of a semiconductor wafer during its heat treatment, in particular during the annealing of metallization on the wafer.

In one aspect, the above and other objects are accomplished by heating the wafer via a susceptor and by measuring the temperature of the wafer indirectly based upon the temperature of the susceptor, independent of the backside conditions of the wafer. Apparatus which embodies this concept comprises: a thin susceptor of constant, high emissivity; means for mounting the susceptor with substantially the entire backside area thereof exposed; means for irradiating the susceptor from at least the backside thereof; and means for monitoring the temperature of the backside of the susceptor. Preferably, the susceptor is material such as silicon carbide or silicon carbide-coated graphite to provide the constant, high emissivity characteristics and is approximately 0.5-8 mm (millimeters) thick to provide fast thermal response.

In another aspect, the means for mounting the susceptor comprises a plurality of fingers arranged for peripherally engaging the susceptor.

In still another more specific aspect, the means for monitoring the temperature of the susceptor is an infrared sensor or a thermocouple.

Our present invention is also embodied in a process for measuring or monitoring the temperature of a wafer independently of the backside conditions of the wafer, comprising: providing a thin, constant high emissivity susceptor; supporting a semiconductor wafer on the susceptor; radiantly heating the susceptor from at least the backside thereof; and monitoring the temperature of the wafer indirectly by monitoring the temperature of the susceptor. The susceptor temperature can be monitored using a thermocouple attached to the susceptor or by sensing thermal energy emitted from the backside thereof.

In yet another aspect, our process comprises the step of calibrating the susceptor relative to the temperature of the wafer by monitoring the temperature of the wafer and the susceptor over a range of temperatures and determining the differences between the wafer and susceptor temperatures over that range.

BRIEF DESCRIPTION OF THE DRAWING

The above and other aspects of the invention are described with respect to the attached FIG. 1 which schematically depicts a wafer annealing system which incorporates wafer heating and wafer temperature monitoring capability in accordance with our present invention.

FIG. 2 illustrates another embodiment of the wafer annealing system of the invention which incorporates an alternate wafer temperature monitoring means.

DETAILED DESCRIPTION OF THE PREFERRED EMBODIMENTS

Figure 1:
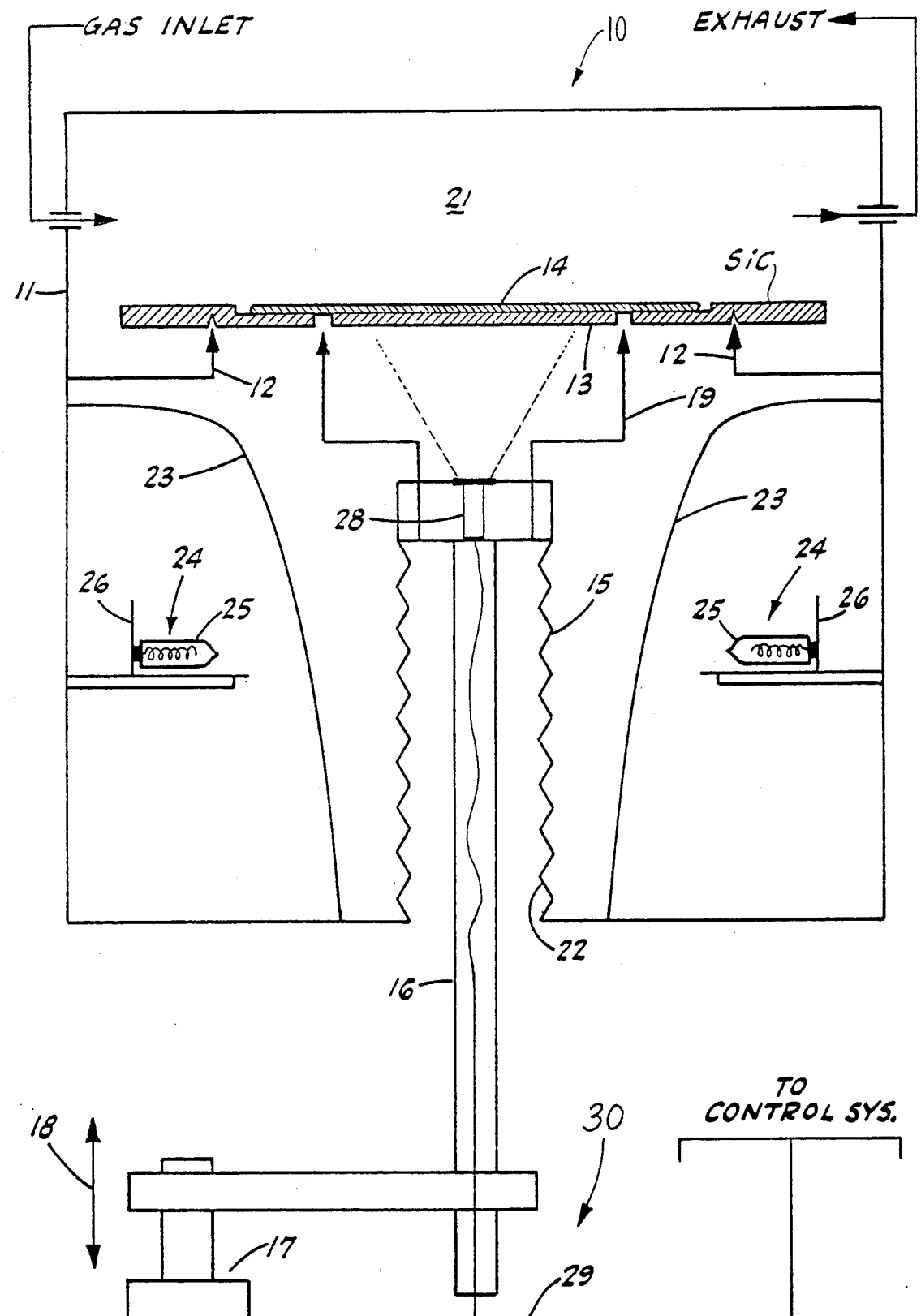

FIG. 1 schematically depicts an example of a wafer temperature monitoring system made in accordance with our present invention, which is incorporated into a wafer annealing system 10. The system 10 includes a vacuum chamber or housing 11. Within the chamber are a plurality of quartz support pins 12 which support a susceptor 13 about its periphery and thus leave exposed substantially all the backside of the susceptor (the bottom side in the figure). The susceptor 13 supports a wafer 14. A combination wafer lift/infrared sensor assembly 15 includes an elevator 16 which is vertically reciprocated by an actuator mechanism 17 along a path indicated generally by arrow 18. Mounted on the upper end of the elevator 16 is a quartz wafer lifter 19 which includes a plurality of pins mounted on a support ring (not shown) for transferring the wafer 14 from the susceptor 13 to a wafer transfer blade (not shown) and vice versa.

The process chamber 21 is isolated from the lift mechanism 15 by a bellows 22 and is isolated from radiant lamp assembly 24 by an envelope or window 23. The susceptor 13 is uniformly heated through the window 23 by the circular array of lamps 25 and the associated reflector assembly 26. Presently, the lamps are infrared and the radiant-energy-transparent window 23 is quartz. Radiant energy lamps or other heating means can be provided at the front side of the wafer as well. Our system for quickly and accurately tracking the temperature of the wafer, and thus accurately monitoring the wafer temperature, also provides fast efficient radiant heating of the wafer which closely tracks the temperature of the susceptor.

Our radiantly heated wafer annealing system 10 includes means for measuring the temperature of the wafer 14 via the susceptor 13, free of the backside conditions of the wafer. The temperature measurement means 30 comprises an infrared sensor in the form of a pyrometer 28 mounted beneath the susceptor, illustratively on the wafer lift elevator 16. Output signals from the pyrometer are applied via line(s) 29 to a computer control system. The closed loop control system uses the temperature data signals obtained from the susceptor to control processing of the wafer and, if desired, to provide a readout of susceptor temperature. Those of usual skill in the art will readily understand that the temperature of the wafer is obtained from that of the susceptor by measuring the actual wafer temperature over a range of susceptor temperatures so that the susceptor temperatures can be calibrated to the wafer temperatures over the range. That is, the temperature of the wafer and that of the susceptor are monitored over a range of temperatures and the difference is used subsequently to provide the actual wafer temperature indirectly, based upon measurement of the temperature of the backside of the susceptor.

Alternatively, as shown in FIG. 2, wherein like numerals for like parts illustrated as in FIG. 1 are retained, the temperature measuring means 30 comprises a thermocouple 31 mounted to the susceptor 13. The thermocouple 31 can also be embedded in the susceptor 13. Output signals from the thermocouple 31 are applied via line 29 to the computer control system as described above.

Our indirect measurement technique, i.e., accurately monitoring the temperature of the wafer indirectly by monitoring the temperature of the susceptor, is made possible by specially adapting the susceptor to the process. First, the susceptor 13 is an optically opaque material having a constant emissivity over the temperature and wavelength ranges of interest.

Preferably, the susceptor is formed of graphite coated with silicon carbide or is solid silicon carbide. The associated emissivity is approximately 0.9. Those of usual skill in the art will derive other materials, compounds and combinations of materials which provide the necessary emissivity so that one can put the wafer on the front side of the susceptor and accurately monitor the temperature thereof via the backside. Secondly, the susceptor is very thin, typically 0.5 mm–8 mm, and preferably 2 mm, to provide a very fast response time so that the susceptor quickly and closely tracks the temperature of the wafer and vice versa.

The above features which accurately provide for monitoring of the wafer heating during processing also effect accurate heating itself. That is, our "indirect" heating of the wafer by conduction from the backside-heated, thin, constant emissivity susceptor also permits quick, accurate uniform heating of the wafer during both the fabrication of layers on the wafer (for example, the formation of silicide layers) and during annealing of such layers.

EXAMPLE OF ANNEALING PROCESS

The following is a description of one exemplary process for annealing metallization on a semiconductor wafer.

Initially, a robot arm is used to load the wafer onto the susceptor under vacuum conditions of at least about $10^{-7}$ torr. Once the wafer is in place, the robot arm is retracted and the associated chamber opening closed to isolate the chamber from the transfer chamber. Then the chamber is back-filled to atmospheric pressure (800 torr) or to any level of vacuum, with gas or mixtures such as $N_2$, $NH_3$, Ar, forming gas, a combination of nitrogen and oxygen, a combination of argon and oxygen, etc. Once the gas conditions are established, the computer (1) controls the operation of the lamps to ramp up the temperature of the susceptor and wafer at the programmed rate to the process set point and then (2) maintains a constant susceptor temperature (or varies the temperature as required). Typically, temperatures of 300° C.–1,000° C. are used for annealing metals, which can be refractory metal such as silicides, aluminum, aluminum composites such as aluminum silicon, aluminum copper, aluminum silicon copper or basically any metal used in the semiconductor industry.

In addition to the above-described advantages, the present temperature-monitoring apparatus and process have the advantage of very little background noise. This is important at lower temperatures, where the amount of energy emitted from the wafer or susceptor is reduced and the process is sensitive to background noise. In addition, at temperatures below about 600° C., the silicon wafers are thermally transparent and the effect of front side structures is increased.

Having thus described preferred and alternative embodiments of our present invention, those of usual skill in the art will readily devise modifications which are within the scope of the attached claims.

We claim:

1. Apparatus for measuring the temperature of a semiconductor wafer, during heat treatment of the wafer, comprising:
    a thin, constant emissivity susceptor for providing fast thermal response between the susceptor and a wafer supported on the front side of the susceptor;
    means for mounting the susceptor with substantially the entire backside area thereof exposed;
    means for heating the susceptor from at least the backside thereof; and
    means for monitoring the temperature of the backside of the susceptor, whereby the temperature of the wafer can be indirectly determined.

2. The apparatus of claim 1, wherein emissivity of the susceptor is about 0.9 and the susceptor is approximately 0.5 mm–8 mm thick.

3. The apparatus of claim 1 or 2, wherein the susceptor is silicon carbide or silicon carbide-coated graphite.

4. The apparatus of claim 1, wherein the means for mounting the susceptor comprises a plurality of fingers arranged for engaging the periphery of the susceptor.

5. The apparatus of claim 1, wherein the means for monitoring the temperature of the backside of the susceptor is an infrared sensor.

6. The apparatus of claim 1, wherein the means for monitoring the temperature of the backside of the susceptor is a thermocouple.

7. A process for monitoring the temperature of a semiconductor wafer, during heat treatment thereof comprising:
    providing a constant emissivity susceptor;
    supporting the susceptor so as to leave substantially all of the backside of the susceptor uncovered;
    supporting a semiconductor wafer on the front side of the susceptor;
    heating the susceptor from at least the backside thereof; and
    monitoring the temperature of the wafer indirectly by monitoring the temperature of the backside of the susceptor.

8. The method of monitoring the temperature of a wafer of claim 7, wherein the emissivity of the susceptor is about 0.9 and the susceptor is approximately 0.5 mm–8 mm thick.

9. The method of claim 7 or 8, wherein the susceptor is silicon carbide or silicon carbide-coated graphite.

10. The temperature monitoring method of claim 7, wherein the susceptor temperature is measured using a thermocouple attached to the susceptor.

11. The temperature monitoring method of claim 7, wherein the susceptor temperature is measured by sensing thermal energy emitted from the backside thereof.

12. The method of monitoring the temperature of a wafer of claim 7, further comprising the step of calibrating the susceptor relative to the temperature of the wafer by monitoring the temperature of the wafer and the susceptor over a range of temperatures and determining the difference in temperature between the wafer and the susceptor over the temperature range.

13. Apparatus for measuring the temperature of a wafer during heat treatment thereof which comprises:
 a) a susceptor having a known emissivity of the backside thereof;
 b) means for mounting said susceptor so that its backside is exposed,
 c) means for mounting a semiconductor wafer onto the frontside of said susceptor,
 d) means for heating said susceptor, and
 e) means for measuring the temperature of the backside of said susceptor whereby the temperature of said wafer is measured indirectly from the temperature of said susceptor.

14. Apparatus according to claim 13 wherein the means for measuring the temperature of the backside of the susceptor comprises means for measuring thermal radiation emitted from the backside surface of the susceptor, and means for calculating the temperature of the susceptor based on the measured radiation.

15. Apparatus according to claim 14 wherein the means for measuring the temperature of the backside of the susceptor comprises a thermocouple mounted on or embedded in said susceptor.

16. Apparatus according to claim 14 wherein the means for measuring the temperature of the backside of the susceptor comprises an infrared sensor.

17. A method of indirectly measuring the temperature of a semiconductor wafer during heat treatment thereof which comprises
 a) contacting said wafer with the frontside of a susceptor having a known emissivity,
 b) heating said susceptor from the backside thereof,
 c) measuring the temperature of the backside of said susceptor, and
 d) calculating the temperature of said wafer from the temperature of said susceptor.

18. A method according to claim 17 wherein the temperature of the backside of said susceptor is measured by measuring the thermal radiation emitted from the backside surface of said susceptor and calculating the temperature of the susceptor based on the measured radiation.

19. A method according to claim 18 wherein the thermal radiation is measured by means of a thermocouple mounted on or embedded in said susceptor.

20. A method according to claim 18 wherein the thermal radiation is measure by means of an infrared sensor.

* * * * *